(12) United States Patent
Lee et al.

(10) Patent No.: US 6,933,614 B2
(45) Date of Patent: Aug. 23, 2005

(54) INTEGRATED CIRCUIT DIE HAVING A COPPER CONTACT AND METHOD THEREFOR

(75) Inventors: Chu-Chung Lee, Round Rock, TX (US); Fuaida Harun, Selangor (MY); Kevin J. Hess, Austin, TX (US); Lan Chu Tan, Selangor (MY); Cheng Choi Yong, Selangor (MY)

(73) Assignee: Freescale Semiconductor, Inc., Austin, TX (US)

( * ) Notice: Subject to any disclaimer, the term of this patent is extended or adjusted under 35 U.S.C. 154(b) by 5 days.

(21) Appl. No.: 10/662,541

(22) Filed: Sep. 15, 2003

(65) Prior Publication Data

US 2004/0195696 A1 Oct. 7, 2004

(30) Foreign Application Priority Data

Apr. 2, 2003 (MY) .......................... PI20031227

(51) Int. Cl.⁷ .............................................. H01L 23/48
(52) U.S. Cl. .................. 257/780; 257/781; 257/750; 257/758; 257/775
(58) Field of Search .................... 257/780, 781, 257/750, 758, 775

(56) References Cited

U.S. PATENT DOCUMENTS

| | | | |
|---|---|---|---|
| 4,821,148 A | | 4/1989 | Kobayashi et al. |
| 5,136,359 A | * | 8/1992 | Takayama et al. .......... 257/774 |
| 5,771,157 A | | 6/1998 | Zak |
| 6,218,732 B1 | | 4/2001 | Russell et al. |
| 6,230,719 B1 | | 5/2001 | Wensel |
| 6,242,103 B1 | * | 6/2001 | Farnworth et al. .......... 428/458 |
| 6,268,662 B1 | | 7/2001 | Test et al. |
| 6,352,743 B1 | | 3/2002 | Ellis et al. |
| 6,380,626 B1 | | 4/2002 | Jiang |
| 6,413,576 B1 | | 7/2002 | Ellis et al. |
| 6,610,601 B2 | | 8/2003 | Li et al. |
| 6,727,570 B2 | | 4/2004 | Woo |
| 2002/0054955 A1 | | 5/2002 | Ellis et al. |
| 2002/0137330 A1 | * | 9/2002 | Ryan ....................... 438/628 |

FOREIGN PATENT DOCUMENTS

| | | | |
|---|---|---|---|
| DE | 10064691 A1 | * 4/2002 | ............ 257/E23.02 |
| EP | 1 126 519 A2 | 8/2001 | |

* cited by examiner

*Primary Examiner*—Jasmine Clark
(74) *Attorney, Agent, or Firm*—Joanna G. Chiu; David G. Dolezal

(57) ABSTRACT

An integrated circuit die (10) has a copper contact (16, 18), which, upon exposure to the ambient air, forms a native copper oxide. An organic material is applied to the copper contact which reacts with the native copper oxide to form an organic coating (12, 14) on the copper contact in order to prevent further copper oxidation. In this manner, further processing at higher temperatures, such as those greater than 100 degrees Celsius, is not inhibited by excessive copper oxidation. For example, due to the organic coating, the high temperature of the wire bond process does not result in excessive oxidation which would prevent reliable wire bonding. Thus, the formation of the organic coating allows for a reliable and thermal resistance wire bond (32, 34). Alternatively, the organic coating can be formed over exposed copper at any time during the formation of the integrated circuit die to prevent or limit the formation of copper oxidation.

15 Claims, 2 Drawing Sheets

US 6,933,614 B2

INTEGRATED CIRCUIT DIE HAVING A COPPER CONTACT AND METHOD THEREFOR

FIELD OF THE INVENTION

The present invention relates generally to integrated circuits, and more particularly, to integrated circuit die having copper contacts.

BACKGROUND OF THE INVENTION

In integrated circuit manufacturing, wire bonding is a well proven method used to connect a semiconductor die having electrical circuitry to a pin on a component package. It is also becoming increasingly common to use copper metal interconnects. However, wire bonding directly to copper is not feasible using existing production assembly equipments due to the instability of the native copper oxide at wire bonding temperatures (typically greater than 130 degrees to 170 degrees Celsius).

One solution available today is the use of an aluminum capping layer which is used over the copper bond pads such that the wire bonds are bonding to the aluminum rather than the copper. However, adding an aluminum capping layer increases processing costs. Furthermore, the use of an aluminum capping layer also requires the use of a barrier layer and/or a glue layer between the aluminum capping layer and the copper bond pads which further increases processing costs. Also, an aluminum to gold wire bond typically has reduced mechanical strength as compared to a copper to gold bond.

Another solution available today is the use of a ceramic capping layer which is used over the copper bond pads. The wire bonds must therefore break through the ceramic capping layer via thermosonic energy provided by wire bonders to achieve connection to the copper bond pads. In this solution, the ceramic capping layer is blanket deposited over the entire wafer. However, in order for the wire bonds to be able to break through the ceramic capping layer, the capping layer must be very thin. However, it is difficult to maintain acceptable uniformity when blanket depositing a thin layer thus resulting in reduced assembly yield. Furthermore, the need for a blanket deposit also increases processing costs.

Therefore, a need exists for an improved integrated circuit die having a copper contact which has improved reliability and thermal resistance, while reducing processing costs and increasing assembly yield.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally, embodiments of the present invention provide an integrated circuit die having copper contacts coated with an organic material. The organic coating helps to prevent or limit copper oxidation of exposed copper contacts which can become especially problematic at temperatures greater than room temperature and even more problematic at temperatures greater than 100 degrees Celsius. For example, in a wire bonding process, the organic coating can be used to prevent excessive copper oxidation such that an improved wire bond can be formed to the copper contact. The organic coating may also be used in a variety of other applications to prevent or limit copper oxidation to achieve improved reliability and thermal resistance.

Figure 1:
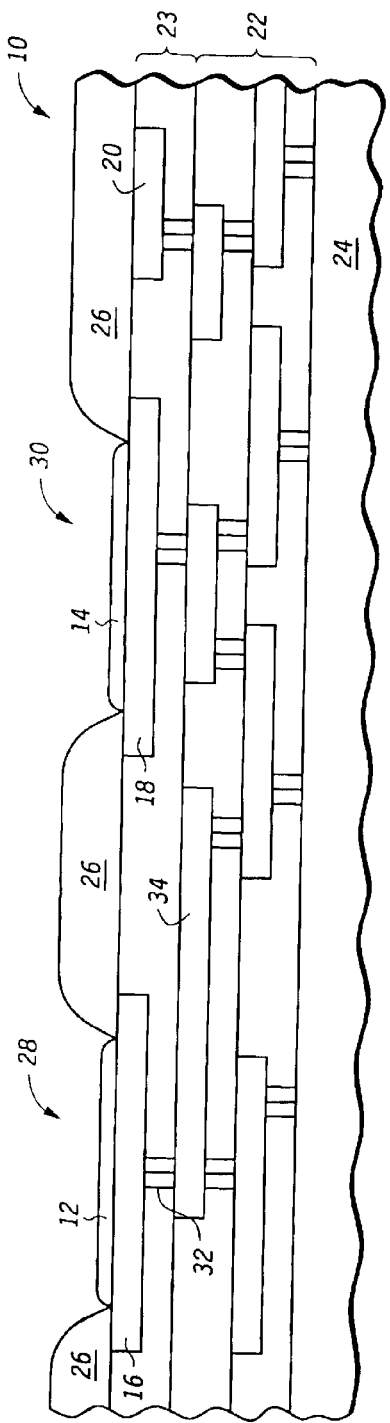
FIG. 1 illustrates a cross-sectional view of an integrated circuit die having coated copper contacts in accordance with one embodiment of the present invention.

FIG. 1 illustrates a portion of an integrated circuit die 10 having active circuitry 24, metal interconnect layers 22 overlying active circuitry 24, final metal interconnect layer 23 overlying metal interconnect layers 22, and passivation layer 26 overlying final metal interconnect layer 23. Active circuitry 24 can include a variety of circuit components used to achieve different functions. For example, active circuitry 24 may include combinations of analog and digital circuitries, memories (which may contain software stored therein), etc., which can be used to achieve the desired functionalities of integrated circuitry die 10. Metal interconnect layers 22 include metal wirings and vias used to provide electrical connections between active circuitry 24 and final metal interconnect layer 23. Final metal interconnect layer 23 includes a final metal layer which includes metal wire 20 and contacts 16 and 18. Final metal interconnect layer 23 also includes vias such as via 32 which provides electrical connection to the underlying metal interconnect layers 22. For example, via 32 provides an electrical connection to metal wire 34. In one embodiment, the metal wires and vias of metal interconnect layers 22 and 23 may be formed of copper. Alternatively, the metal wires and vias of interconnect layer 22 may be formed of aluminum, or any other appropriate metal. Also note that the metal wires and vias of metal interconnect layers 22 and 23 are electrically isolated, as needed, by a dielectric material, as known in the art.

Note that in one embodiment, integrated circuit die 10 may be one of a plurality of integrated circuit die located on a semiconductor wafer. Note that copper contacts 16 and 18 may also be referred to as copper bond pads, wire bond pads, or copper bond posts. Note also that the descriptions provided herein will use copper contacts 16 and 18 as examples; however, note that a copper contact may refer to an exposed copper contact at any point during the processing of integrated circuit die 10 or a package substrate where the oxidation of the exposed copper is to be prevented. For example, the organic coating described herein may also be used during the formation of metal interconnect layers 22 or for coating copper bond posts.

Referring still to FIG. 1, passivation layer 26 overlying final metal interconnect layer 23 includes openings 28 and 30 which expose copper contacts 16 and 18. (Note that passivation layer 26 may be formed using any appropriate passivating material and any appropriate method, as known in the art. Note also that passivation layer 26 may also be referred to as insulating layer 26) After formation of openings 28 and 30 to expose copper contacts 16 and 18, organic coatings 12 and 14 are formed on the copper contacts 16 and 18, respectively. Organic coatings 12 and 14 are used to prevent the further oxidation of the copper metal of copper contacts 16 and 18. That is, once copper contacts are exposed to the oxygen in the surrounding air, the copper begins to oxidize. However, at increased temperatures (those above room temperatures, and especially those above 100 degrees Celsius), the copper oxidation rate increases significantly. This excessive copper oxide thickness created at higher temperatures causes problems in future processing.

For example, the wire bond process requires high temperatures (generally above 100 degrees Celsius). Although some copper oxide is formed at the exposed regions of copper contacts 16 and 18 at room temperature (also referred to as native copper oxide), upon exposure to the elevated temperatures used during the wire bond process, excessive copper oxide is formed over copper contacts 16 and 18. It is this excessive copper oxide which prevents the ability to form a reliable wire bond. Organic coatings 12 and 14 are therefore used to prevent this excessive oxidation. In one embodiment, benzotriazole (BTA) is used as the organic material for forming organic coatings 12 and 14. BTA chemically reacts with copper oxide in order to form a protective coating. That is, the BTA reacts with the native copper oxide to prevent the further oxidation of the copper. (In some cases, the BTA may also react with the underlying copper.) The BTA reaction with the copper oxide therefore creates a thermally stable protective film (e.g. organic coatings 12 and 14) which allows for subsequent reliable wire bonding.

Therefore, although the above description was provided in reference to wire bonding, an organic material, such as BTA, may be used in other applications where the prevention of copper oxidation (or the limiting of copper oxidation) is desired. Also, note that in alternate embodiments, other materials may be used to form the organic coating. For example, BTA is an organic material which includes molecules having a Nitrogen-Hydrogen (N—H) bond which possibly bonds to the copper oxide to form a protective organic film. Therefore, other organic materials having a similar structure may also be used. For example, other organic materials which have an N—H bond similar to BTA that may be used to form the organic coating include, but are not limited to, tolyltriazole, imidazoles, benzoimidazoles, phenylazo-pyrazolones, benzyl carboxy triazoles, polyaniline, polyimidazoles, poly aminotriazoles, poly aminophenols, phthalocyanine derivatives, amino carboxylic acids, amino polycarboxylic acids, hytroxyphenol hydrazine derivatives, benzaloxalydihydrazine derivatives, naphthoylhydrazine compounds, and diacylhydrazines. Also, in an alternate embodiment, the organic material used may be any combination of the above organic materials.

In one embodiment, the organic coating (such as organic coatings 12 and 14) has a thermal resistance of greater than or equal to 100 degrees Celsius. In the case of wire bonding, this thermal resistance allows for the reliable formation of wire bonds to the copper contacts. Also, the organic coating is generally thin, such as, for example, 150 Angstroms or less. Preferably, the coating thickness is less than or equal to 100 Angstroms, and more preferably, less than or equal to 50 Angstroms. Therefore, in the case of wire bonding, the wire bond is able to break through both the organic coating and the copper oxide to form a reliable electrical connection to the copper contact.

Figure 2:
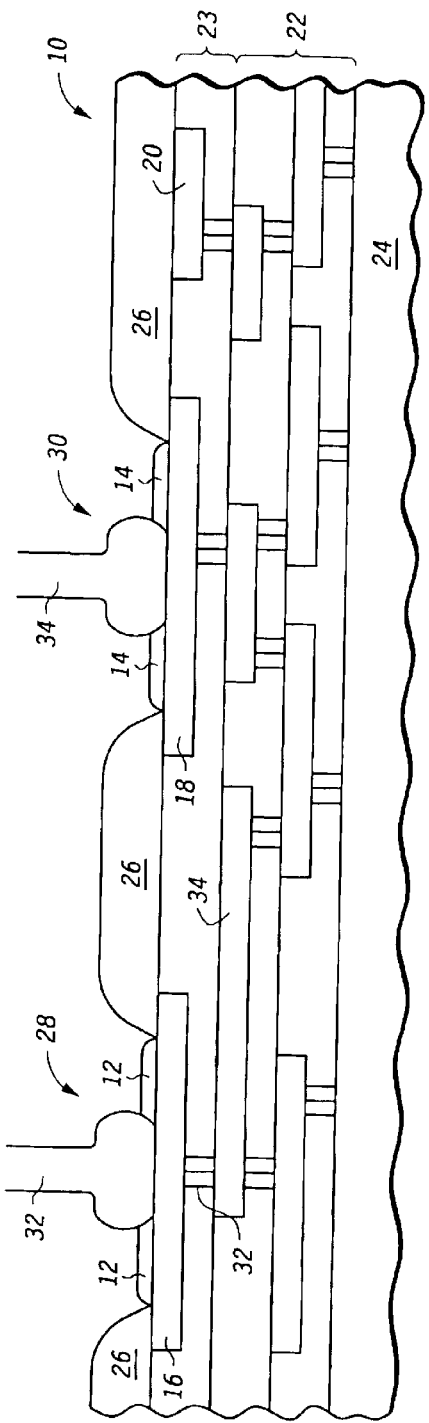
FIG. 2 illustrates a cross-sectional view of the integrated circuit die having wire bonds attached to the copper contacts in accordance with one embodiment of the present invention.
Figure 3:
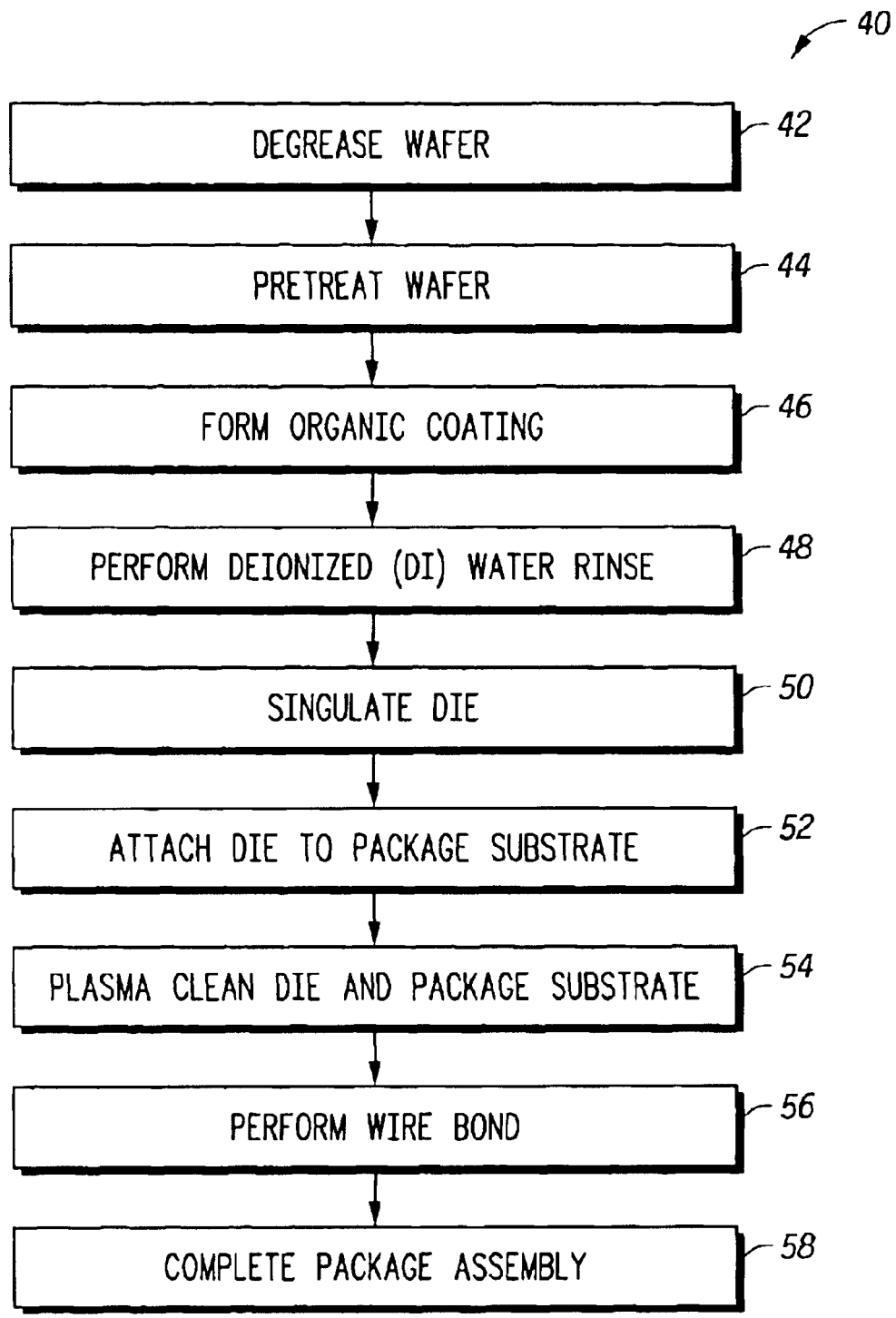
FIG. 3 illustrates, in flow diagram form, a method for forming an integrated circuit die having coated copper contacts in accordance with one embodiment of the present invention.

In order to better describe the formation of organic coatings 12 and 14, the process will be described below in reference to FIG. 3. FIG. 3 illustrates a process for forming the organic coatings on integrated circuit die 10 in accordance with one embodiment of the present invention and will be described in reference to FIGS. 1 and 2. After formation of openings 28 and 30 (in FIG. 1), the semiconductor wafer including integrated circuit die 10 is degreased (block 42 of FIG. 3). Degreasing the wafer includes washing the wafer with a dilute caustic solution to remove organic contaminants (such as finger oils, airborne contaminants, etc.). Processing then continues with block 44 of FIG. 3 where the wafer is pretreated. Pretreating includes cleaning the wafer to stabilize the preexisting copper oxide. In one embodiment, a dilute acid solution (of, for example, 0.5 Molars) is used to clean the wafer to remove contaminants. Alternatively, a dilute acid solution having a concentration of less than 2 Molar may be used. In one embodiment, the dilute acid solution is a dilute sulfuric solution. In an alternate embodiment, a dilute persulfate solution may be used in place of the dilute acid solution. Processing then continues to block 46 where the organic coating is formed by applying the organic material. This organic coating may be formed in a variety of ways, such as, for example, by dipping the wafer into a solution of the organic material, using a spin-on process, by spraying the wafer, by physical vapor deposition (PVD), or by chemical vapor deposition (CVD). In one embodiment, the organic coating is formed on the copper contact by exposing the copper contact to a solution of the organic material having a pH level of greater than 7, or preferably, greater than 7.5, or more preferably, between 7.5 and 8.

For example, in one embodiment using BTA as the organic material to form organic coatings 12 and 14, a dipping solution may be used to apply BTA onto copper contacts 16 and 18 to form organic coatings 12 and 14. In this embodiment, the BTA can be applied from a solution having a pH of greater than or equal to 7. In one embodiment, an aqueous solution includes BTA and a caustic such as potassium hydroxide (KOH) or sodium hydroxide (NaOH) as a buffer, where the aqueous solution has a pH of greater than or equal to 7. In this embodiment, the pH of at least 7 ensures that the native copper oxide used to chemically react with the BTA remains intact during the dipping process. That is, if the pH of the solution is too low, the solution may remove the native copper oxide, thus preventing the formation of the organic coating because the organic material would be unable to reliably react with the copper oxide. Furthermore, in this embodiment, in order to reliably form the organic coating, the wafer is dipped into the solution for at least 5 minutes.

As mentioned above, alternate embodiments may use other organic materials and other dipping solutions for applying the organic materials. For example, BTA may be applied using other dipping solutions other than an aqueous solution. Also, different pH levels for the dipping solution may be used so long as sufficient copper oxide remains intact to chemically react with the organic material and form the organic coatings. Also, note that since the organic coating is formed through the reaction of the organic material and the copper oxide, the organic coating is generally formed over exposed regions of copper. Therefore, organic coatings 12 and 14 are preferentially formed on copper contacts 16 and 18, as illustrated in FIG. 1. This removes the need to provide a uniform blanket deposition and thereby improves reliability.

Referring back to FIG. 3, after forming the organic coating, flow proceeds to block 48 where a deionized (DI) water rinse of the wafer is performed. The DI water rinse removes unreacted BTA and remnants of the dipping solution or other contaminants introduced by the process used to form the organic coating. Flow then proceeds to block 50 where the die are singulated from the wafer. That is, integrated circuit die 10 may be a singulated die or may still be part of the semiconductor wafer. The die can be singulated using methods known in the art, such as by sawing or by laser ablation. Note also that multiple die may be singulated together such that the resulting singulated die actually includes multiple die. Flow then proceeds to block 52 where the die is attached to a package substrate. That is, integrated circuit die 10, upon singulation, may be attached to a package substrate in a variety of ways as known in the art, such as by using an epoxy adhesive or polyimide adhesive, or any other known die attach. The package substrate may include, for example, a ball grid array (BGA) substrate, lead frame, multi-die package, etc.

Flow then proceeds to block 54 where the package substrate and the attached singulated die are plasma cleaned. The plasma clean removes some of the impurities of the package substrate and die. In one embodiment, the plasma clean includes applying an Argon-Hydrogen gas mixture in an RF field. In an alternate embodiment, the plasma clean includes applying Argon-Oxygen gas mixture in either an RF or microwave field. Flow then proceeds to block 56 where wire bonding is performed. Wire bonding will be described in reference to FIG. 3.

FIG. 3 illustrates integrated circuit die 10 after a wire bond process where wire bonds 32 and 34 are formed within openings 28 and 30, respectively. Therefore, using conventional wire bond processes, wire bond 32 is attached to copper contact 16 to provide an electrical connection to copper contact 16. Similarly, wire bond 34 is attached to copper contact 18 to provide an electrical connection to copper contact 18. Note that in attaching wire bonds 32 and 34, the wire bonds break through organic coatings 12 and 14, respectively, in order to form the electrical connections. Therefore, note that portions of the organic coatings 12 and 14 may remain on integrated circuit die 10 on either side of wire bonds 32 and 34 after the wire bonding process is complete, as shown in FIG. 2. Also note that small amounts of the organic coating may still be present between the wire bonds and the copper contacts (not shown). Since the organic coatings are present on the copper contacts during the wirebonding process, more reliable wire bonds are formed because the organic coatings prevent the further oxidation of the copper contact surfaces at elevated temperatures typically used in the wirebonding process (greater than 100 degrees Celsius). Note that a variety of different materials may be used for wire bonds 32 and 34, such as, for example, gold, copper, aluminum, etc.

Referring back to FIG. 3, after performing the wire bond process, flow proceeds to block 58 where package assembly is completed using conventional processing to form a completed packaged semiconductor device.

Note that in alternate embodiments, the flow of FIG. 3 may bypass blocks 50, 52, and 54. In this alternate embodiment, integrated circuit die 10 may not be singulated, thus remaining in wafer form. The wafer can then be plasma cleaned (similar to the plasma clean of block 54) and the wire bonding of block 56 can be performed on the semiconductor wafer rather than on the singulated die.

In one embodiment of the present invention which uses wire bonding to provide electrical contacts to the integrated circuit die, copper bond posts may be used on the package substrate to provide electrical contacts from the package substrate to the integrated circuit die. In this embodiment, a wire bond connection is made to both the copper contact on the integrated circuit die (i.e. the copper wire bond pad) and the copper contact on the package substrate (i.e. the copper bond post). As described above, an organic coating can be formed on the copper contact on the integrated circuit die to allow for an improved wire bond connection. However, note that the organic coating may also be formed on the copper contact on the package substrate (i.e. the copper bond post) in order to prevent excessive copper oxidation and allow for a direct electrical contact of the wire bond to the copper bond post. In this manner, an improved wire bond is achieved that is reliable and thermally resistant. Furthermore, this embodiment prevents the need to use an additional protective layer on the copper bond post such as a nickel-gold layer to protect the copper. The use of the organic coating rather than the nickel-gold layer allows for finer pitches of the copper bond posts on the package substrate and also reduces manufacturing cost.

Also, although the above descriptions were provided with respect to copper contacts 16 and 18 used for wire bonding, alternate embodiments may use the organic coating for a variety of other application. For example, in one embodiment, large copper tabs may be used as copper contacts, such as in power device applications. In this embodiment, the same organic coating described above may be used to provide reliable electrical connections (such as, for example, wire bond connections) to the copper contacts. In other embodiments, such as in RF applications, copper inductors are used where an electrical connection to the copper inductor may be desired. The organic coating described herein may therefore also be used to protect the copper inductors from excessive oxidation in order to provide a reliable, thermally resistant, electrical contact.

Therefore, as can be appreciated, embodiments of the organic coating described herein may be used to prevent or limit the excessive oxidation of copper contacts, thereby resulting in improved reliability and thermal resistance. Note also that embodiments of the organic coating may allow for a direct electrical contact between a wire bond, which is typically gold, to the copper contact, thus resulting in a mechanically stronger contact than previously available. Furthermore, embodiments of the organic coating allow for this direct electrical contact between the copper contact and the wire bond while using existing production assembly equipments. Embodiments of the organic coating can also prevent the need for additional metal layers or blanket depositions, thus reducing cost. Furthermore, the improved reliability and thermal resistance and the stronger contact results in improved assembly yield.

In the foregoing specification, the invention has been described with reference to specific embodiments. However, one of ordinary skill in the art will appreciate that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variations thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit die comprising:
   a copper contact, wherein the copper contact is a wire bond pad;
   a coating on the copper contact, the coating including a material formed from a reaction of an organic material with copper oxide.

2. The integrated circuit die of claim 1 wherein the coating is formed by exposing the copper contact to a solution that includes the organic material.

3. The integrated circuit of claim 2 wherein the solution has a pH level of at least 7.

4. The integrated circuit of claim 3 wherein the solution has a pH level of at least 7.5.

5. The integrated circuit of claim 1 wherein the organic material includes molecules having nitrogen-hydrogen bonds.

6. The integrated circuit of claim 1 wherein the organic material includes benzotriazole.

7. The integrated circuit of claim 1 wherein the organic material includes at least one of tolyltriazole, imidazoles, benzoimidazoles, polyaniline, and polyimidazoles.

8. The integrated circuit die of claim 1 further comprising:
   a plurality of interconnect layers including a final copper interconnect layer;
   an insulating layer overlying the interconnect layers;
   wherein the copper contact is located in the final copper layer and is accessible by an opening in the insulating layer.

9. The integrated circuit die of claim 8 wherein the coating is located in the opening in the insulating layer.

10. The integrated circuit of claim 1 wherein the coating has a thermal resistance of 100 C or greater.

11. The integrated circuit of claim 1 wherein the coating has a thickness of 150 Angstrom or less.

12. The integrated circuit of claim 1 wherein the coating has a thickness in the range of 20–50 Angstroms.

13. The integrated circuit of claim 1 wherein the coating has a thickness of 50 Angstroms or less.

14. An integrated circuit package including the integrated circuit die of claim 1 and further comprising:
   a package substrate, the integrated circuit die attached to the packaged substrate;
   a wire connected to the copper contact and connected to a contact of the package substrate.

15. An integrated circuit die comprising:
   a plurality of copper bond pads;
   a coating on each of the plurality of copper bond pads, the coating formed from exposing the copper bond pads to a solution that includes an organic material, the organic material includes molecules having nitrogen hydrogen bonds, the coating includes a material formed from a reaction of the organic material with copper oxide, the coating has a thickness of 150 angstroms or less.

* * * * *